United States Patent
Lakhotkin et al.

(10) Patent No.: US 7,166,371 B2
(45) Date of Patent: Jan. 23, 2007

(54) SELF-SHARPENING CUTTING TOOL WITH HARD COATING

(75) Inventors: Yury Viktorovich Lakhotkin, Kidlingtou (GB); Sergey Aleksandrov, Kidlington (GB); Yuri Zhuk, Witney (GB)

(73) Assignee: Hardide Limited, Oxfordshire (GB)

( * ) Notice: Subject to any disclaimer, the term of this patent is extended or adjusted under 35 U.S.C. 154(b) by 0 days.

(21) Appl. No.: 10/509,109

(22) PCT Filed: Mar. 21, 2003

(86) PCT No.: PCT/GB03/01219

§ 371 (c)(1),
(2), (4) Date: Sep. 27, 2004

(87) PCT Pub. No.: WO03/082533

PCT Pub. Date: Oct. 9, 2003

(65) Prior Publication Data

US 2005/0158589 A1    Jul. 21, 2005

(30) Foreign Application Priority Data

Mar. 28, 2002  (GB) .................. 0207375.7

(51) Int. Cl.
  *B26B 9/00*    (2006.01)
  *C23C 16/64*   (2006.01)
(52) U.S. Cl. .................. 428/698; 427/402; 427/419.1; 427/419.7; 428/212; 428/217; 428/336
(58) Field of Classification Search ................ 428/212, 428/217, 336, 698, 174; 427/402, 419.1, 427/419.7
See application file for complete search history.

(56) References Cited

U.S. PATENT DOCUMENTS

| | | | |
|---|---|---|---|
| 2,714,563 A | 8/1955 | Poorman et al. | |
| 4,910,091 A | 3/1990 | Garg et al. | |
| 4,945,640 A | 8/1990 | Garg et al. | |
| 5,262,202 A | 11/1993 | Garg et al. | |
| 5,799,549 A | 9/1998 | Decker et al. | |
| 6,083,570 A | 7/2000 | Lemelson et al. | |
| 6,105,261 A | 8/2000 | Ecer | |
| 6,109,138 A | 8/2000 | Upton | |
| 6,800,383 B1 * | 10/2004 | Lakhotkin et al. | 428/698 |

FOREIGN PATENT DOCUMENTS

| | | |
|---|---|---|
| DE | 2429814 A1 | 6/1974 |
| EP | 0042586 A1 | 12/1981 |
| EP | 0305917 A2 | 3/1989 |
| EP | 0329085 A1 | 8/1989 |
| EP | 0386658 A2 | 9/1990 |
| EP | 0628379 A1 | 12/1991 |

(Continued)

*Primary Examiner*—Archene Turner
(74) *Attorney, Agent, or Firm*—Pearl Cohen Zedek Latzer, LLP

(57) ABSTRACT

There is disclosed a cutting tool having a blade coated on one side with a hard coating living a laminar or layered microstructure. The coating tends to wear evenly and smoothly, thereby keeping a cutting edge of the cutting tool smooth. Furthermore, by coating the cutting edge on one side only, the cutting edge becomes self-sharpening. The coating preferably includes at least one layer made of tungsten carbides substantially or entirely free of metallic tungsten.

46 Claims, 1 Drawing Sheet

FOREIGN PATENT DOCUMENTS

| | | |
|---|---|---|
| EP | 0528592 A1 | 2/1993 |
| EP | 0567300 A1 | 10/1993 |
| EP | 0569660 A1 | 11/1993 |
| EP | 0707921 A2 | 4/1996 |
| EP | 0850731 A2 | 10/1997 |
| EP | 1158070 A1 | 11/2001 |
| EP | 1287953 A1 | 3/2003 |
| JP | 11-133420 | 5/1999 |
| JP | 11-146305 | 5/1999 |
| JP | 11-160681 | 6/1999 |
| JP | 11-305205 | 11/1999 |
| JP | 2002 023648 | 1/2002 |
| JP | 2002 090736 | 3/2002 |
| WO | WO 97/39862 A1 | 4/1997 |
| WO | WO 00/47796 A1 | 2/1999 |

* cited by examiner

SELF-SHARPENING CUTTING TOOL WITH HARD COATING

PRIOR APPLICATION DATA

The present application is a national phase application of International Application PCT/GB03/01219, entitled "SELF-SHARPENING CUTTING TOOL WITH HARD COATING" filed on Mar. 21, 2003, which in turn claims priority from United Kingdom application 0207375.7, filed on Mar. 28, 2002, both of which are incorporated by reference in their entirety.

FIELD OF THE INVENTION

The present invention relates to self-sharpening knives and other cutting tools having blades provided with a hard laminar or layered coating or coatings.

BACKGROUND OF THE INVENTION

The sharpness of the cutting edge of a knife blade or similar cutting tool is an important characteristic for both domestic knives and industrial knives, as well as for cutting tools in general.

It has long been known that the hardness of a blade material is an important contributor to the ability of a cutting edge of the blade to retain sharpness, as a cutting edge made of softer materials quickly becomes blunt. On the other hand a knife blade is often made as a thin strip or as a sheet, and its edge must have some flexibility so as to avoid brittle fracture or chipping when used. The two characteristics of hardness and flexibility or toughness often contradict with each other as most hard materials are typically brittle and easy to fracture.

Historically various techniques including quenching, heat treatment or alloying have been used to achieve the best combination of these two characteristics.

U.S. Pat. No. 6,105,261 describes a self-sharpening blade having a first, harder layer with relatively high wear resistance that substantially defines a cutting edge, and a second, softer layer of material with lower wear resistance, located on one side of the first layer. The thickness of the harder layer is between 0.3 microns and 1.5 mm. The examples given in this US patent include knife blades produced by metalworking or mechanical processing such as rolling several sheets of steel, hot pressing and sintering powders containing diamond and other hard materials, as well as coating deposition on plastics. The mechanical processing typically results in the production of a relatively thick layer of hard material, and does not enable a good blade sharpness to be achieved.

Attempts have been made to produce a knife blade with a hard coating. U.S. Pat. No. 6,109,138 describes a knife blade with one side of its edge coated with a particulate material in a matrix. It is stated that the matrix is softer than the particulate material, and the coating is such that a considerable number of the particulates project from the matrix thereby defining a cutting tip on the blade edge. This knife blade has enhanced edge retention characteristics and finds practical applications, for example, in domestic kitchen knives. However, knives with this type of coating have a number of disadvantages that limit their applications. The coating process does not allow a thin coating to be produced—the coating thickness is typically 25–30 microns. The coating consists of randomly distributed hard particles in a substantially softer metal matrix, and this coating structure does not therefore serve to form a straight self-sharpening edge within the thickness of the coating layer. This sets a limitation on the sharpness that can be achieved with a blade having such a thick hard coating layer. Furthermore, the cutting edge formed by discrete particles of hard material projecting from a matrix does not provide a smooth cutting action, but instead acts by tensile tearing of the material being cut. This typically requires a higher force to be applied to the cutting edge as compared to a purely compressive cutting action of a scalpel, for example. The coatings are normally used in an "as-deposited" condition; in other words, there is no additional or post-machining performed on the coating itself, which typically has a rough morphology. This surface roughness and resulting increased friction between the coating and the material being cut further contribute to impede the cutting action. Accordingly, cutting tools provided with this type of coating are restricted in their application due both to limited sharpness and rough surface morphology (leading to tearing rather than cutting).

Various attempts to make blades with hard coatings consisting of tungsten carbide particles in cobalt or another soft metal matrix have shown that a so-called "self-sharpening effect" depends strongly on the coating structure and properties. For example, the High Velocity Oxygen Fuel (HVOF) process for deposition of a tungsten carbide in cobalt matrix coating does provide the self-sharpening effect and is used in practice. By way of contrast, a similar coating process known as plasma spraying, when used to deposit a WC/Co coating, does not achieve the self-sharpening effect. Although both HVOF and plasma sprayed coatings consist of tungsten carbide particles in a cobalt matrix, and are produced by similar methods of spraying, the difference in their performance to produce cutting tools demonstrates that it is not easy or obvious to achieve the self-sharpening effect. Indeed, producing coatings that provide the self-sharpening effect depends strongly on the coating characteristics such as hardness, porosity and microstructure, and requires extensive experimentation and analysis.

EP 0 567 300 describes a hard coating having a columnar crystal structure that extends away from a surface of a blank and to an outer face of the coating. However, the mechanism of wear and fracture in the columnar-structured coating does not provide an optimal structure for edge sharpness. The columnar coating wears by fracture of the microcrystalline columns and their groups, and does not allow sharpening within the coating layer. As a result, the edge sharpness is defined by the thickness of the coating.

These techniques, although enhancing the edge retention characteristics of a blade, do not generally enable a smooth and sharp scalpel-like blade to be formed. This is particularly important when the blade is used to cut thin paper (such as tissue) and similar materials that can easily be ripped or torn by an uneven edge.

U.S. Pat. No. 5,799,549 describes razor blades with both sides coated with an amorphous diamond coating having a thickness of at least 400 angstroms, typically about 2000 angstroms. This coating imparts stiffness and rigidity to a thin blade. However, the coating, which has a sub-micron thickness (400 angstroms is equal to 0.04 microns, 2000 angstroms is equal to 0.2 microns) and is formed on both sides of the blade, does not provide for a self-sharpening effect as the blade is used.

EP 0 386 658 and U.S. Pat. No. 4,945,640 describe a wear-resistant coating for sharp-edged tools and a method for its production. The coating is deposited by the method of chemical vapour deposition (CVD), has thickness from 2 to 5 microns and consists of a mixture of free tungsten with $W_2C$ or $W_3C$, or a mixture of free tungsten with both $W_2C$ and $W_3C$. In all variants of this coating there is an admixture of relatively soft metallic tungsten, as a result these coatings typically have moderate hardness, substantially lower than the hardness of pure tungsten carbides. Methods of depositing these coatings are further described in detail in EP 0 329 085, EP 0 305 917, U.S. Pat. Nos. 4,910,091 and 5,262,202. The coating is produced from a gaseous mixture of tungsten hexafluoride, dimethylether (DME), hydrogen and argon. In this process, low-volatility tungsten oxyfluorides are formed due to the reaction between $WF_6$ and oxygen-containing DME. The tungsten oxy-fluorides are difficult to reduce with hydrogen and are buried in the coating layer. This requires an additional heat treatment of the coating described in U.S. Pat. No. 5,262,202 to improve the coating characteristics. The coatings described in these publications have relatively low hardness (below 3000 Hv, typically 2300 Hv), non-uniform structure, and as a result do not enable self-sharpening to be achieved. As described in U.S. Pat. No. 4,945,640 and EP 0 386 658, this coating improves the erosion and abrasion resistance of sharp-edged tools, but does not provide the self-sharpening effect. Without the self-sharpening effect, the hard coating provides only limited improvement in the retention of the sharpness of the cutting tool edge.

Coatings that reduce friction between a cutting blade and a material being cut help to improve the cutting action, and to enable a material to be cut with a lower amount of energy. This has been demonstrated for example with razor blades coated with thin layer of PTFE, which is known for its low friction properties. Although the PTFE coating does not change the razor blade sharpness, the blade can be moved with lower force and thus provides a perception of improved cutting action. Soft PTFE coatings are useful for gentle cutting applications such as shaving hair with a razor blade, but would not survive the more demanding cutting environment faced by machine knives, for example cutting paper, plastics, food products etc. In these conditions, a soft PTFE coating will be quickly abraded and worn away. The cutting action of a machine knife would benefit from a durable coating with low friction that is able to resist wear and abrasion.

The surface roughness of a cutting edge bevel, and in particular the surface roughness of a coating on a cutting edge, also has an effect on the cutting action. A rougher bevel surface often forms a rougher cutting edge with small serrations that contribute to cutting by a tensile tearing action. As compared to the purely compressive cutting action of a smooth scalpel blade, for example, a rough serrated knife would require higher force and higher energy for cutting. Serrated knives are considered as longer lasting than knives with a smooth cutting edge, although they have an inferior cutting action, especially when cutting delicate materials.

DETAILED DESCRIPTION OF THE INVENTION

Figure 1:
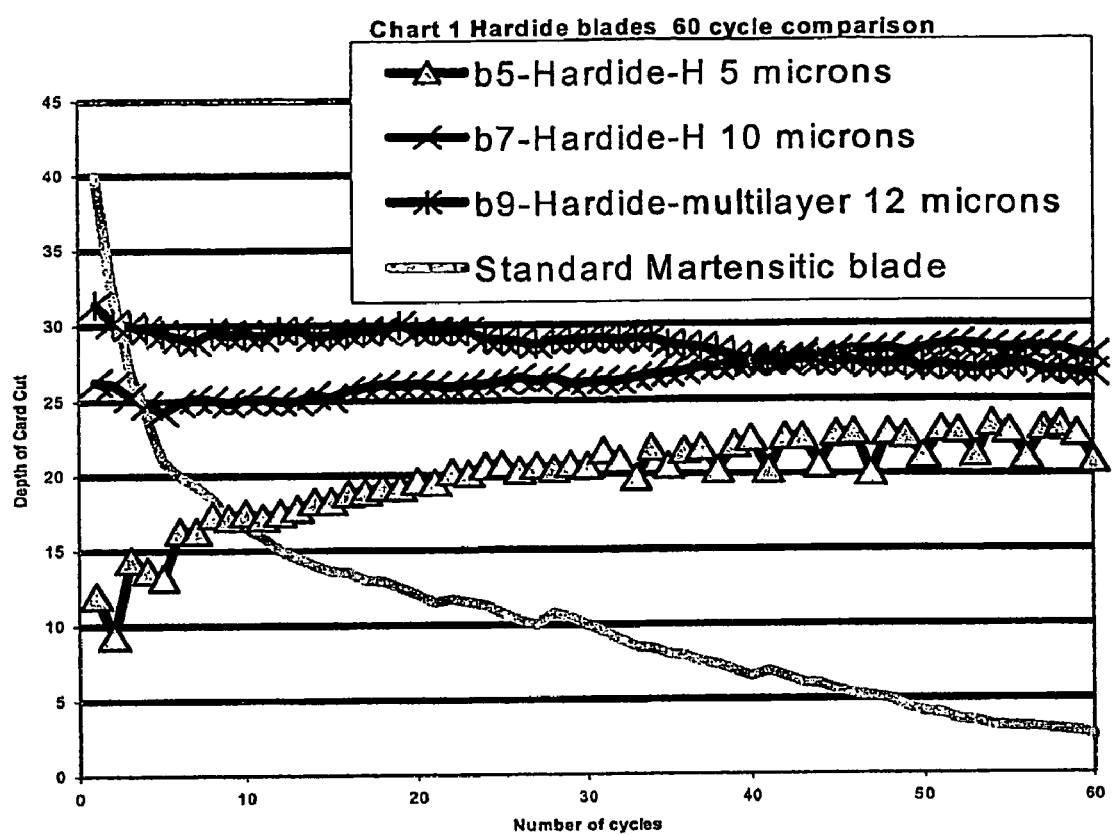
FIG. 1 shows a graph indicating the cutting performance of knives with various coatings.

Embodiments of the present invention seek to provide further improvements in cutting blade construction so as to facilitate cutting, in particular of soft materials that could easily be damaged by tearing or rupture, while maintaining edge retention characteristics of the blade.

Through extensive experimentation and microscopic observations of the wear mechanisms of various coatings, the present applicant has discovered that the best cutting action can be achieved by using an optimal coating structure and a combination of coating properties including hardness, thickness and friction coefficient.

Coatings substantially harder than the blade material are found to reduce the wear rate of the cutting blade. When one side of a blade has the hard coating, this side will wear significantly less than the other side having no coating. As the blade is used to cut various materials, micro-wear results in a gradual removal of material from the non-coated side of the blade.

As a result, after some use the edge is comprised mainly of the hard coating layer, supported from one side by the base blade material. At this stage the behaviour of the coating depends on its microstructure. A coating consisting of particulate material in a softer matrix will have the matrix removed by wear, leaving the particulates projecting from the matrix and forming a substantially uneven edge.

A hard coating having a columnar structure will typically fracture along boundaries between the columnar micro-crystals. When the blade base material is removed by wear, leaving the coating edge with insufficient support, small micro-crystalline particles will break away from the coating. In this event, the edge sharpness is defined by the thickness of the coating layer. A thick coating typically does not provide sufficient sharpness, and to improve its cutting ability this type of blade is often made with serrations/scallops to the non-coated side. This again makes the edge essentially uneven and affects the cutting action.

According to a first aspect of the present invention, there is provided a self-sharpening cutting tool having a cutting edge made of a first material or materials, the cutting edge being coated only on one side thereof with a coating substantially harder than the first material or materials, characterised in that the coating has a layered or laminar microstructure aligned substantially parallel to the coated side of the cutting edge.

According to a second aspect of the present invention, there is provided a method of manufacturing a self-sharpening cutting tool, the method comprising the steps of:

i) providing a cutting edge made of a first material or materials;

ii) coating only one side of the cutting edge with a coating substantially harder than the first material or materials;

characterised in that the coating has a layered or laminar microstructure aligned substantially parallel to the coated side of the cutting edge.

Coatings having a layered or laminar microstructure exhibit different behaviour to the known coatings for cutting edges. When the blade substrate material is worn away and does not provide sufficient support for all of the coating, micro-particles of the coating break away following the layered or laminar structure pattern. This leaves a thinner coating on the blade edge that enhances the edge sharpness. The layered or laminar microstructure also allows sharpening within the thickness of the coating layer, so that an edge sharper than the actual coating layer can be achieved. The edge is smooth and scalpel-like and makes a smooth and clear cut, unlike saw-like blades that can tear or rupture the material being cut.

By comparative testing and analysis of cutting tool wear, the present applicant has discovered that a layered or laminar structure of coating with the hardness of one layer being substantially higher than the hardness of other layers serves to improve the edge sharpness even further. This coating structure enables a bevel or bevels to be formed within the coating thickness by known methods of sharpening, and as a result the edge radius can be reduced to substantially less than the coating thickness. This structure of the coating further allows a cutting edge formed that demonstrates self-sharpening within the coating thickness. This occurs when the coating layer (or layers) with lower hardness are worn away first as compared to the hardest layer within the coating. As a result the hardest layer protrudes from the coating and forms an even sharper cutting edge. Since the coating is continuous and aligned along the tool edge, this cutting edge will be continuous and uniform and will thus provide a smooth cutting action. The continuing wear will maintain the sharpness of the edge formed by this layered coating.

The coating may comprise tungsten carbide or mixtures of tungsten carbides substantially or entirely free of metallic tungsten. By mixtures of tungsten carbides is meant mixtures of two or more of WC, $W_2C$, $W_3C$ and $W_{12}C$.

The coating may comprise a multilayered coating, a topmost layer of the coating comprising tungsten carbide or mixtures of tungsten carbides substantially or entirely free of metallic tungsten The coating may comprise a multilayered coating comprising layers of differing hardnesses, at least one of the layers being a hardest layer.

The coating may comprise a multilayered coating comprising layers of differing hardnesses, a hardest layer of which comprises tungsten carbide or mixtures of tungsten carbides substantially or entirely free of metallic tungsten.

The hardest layer may be a topmost layer of the coating, or an intermediate layer or a base layer.

The coating may comprise layers of tungsten, tungsten carbides and/or mixtures of tungsten with tungsten carbides alloyed with fluorine in amounts ranging from 0.0005 to 0.5 wt %.

The coating may comprise layers of tungsten and tungsten carbides substantially or entirely free of metallic tungsten, the tungsten carbides being alloyed with fluorine in amounts ranging from 0.0005 to 0.5 wt %.

The coating may have abase layer of tungsten.

The layers of the multilayer coating may be arranged in sequentially increasing order of hardness from the cutting edge to a topmost layer of the coating.

The coating or a topmost layer thereof may have a friction coefficient against cemented carbide of 0.3 or less.

The coating may be produced by Chemical Vapour Deposition in a vacuum chamber at a pressure lower than atmospheric pressure and at a temperature above 350° C., preferably from 450° C. to 550° C.

The coating may have a total thickness from 1 to 25 microns, preferably 3 to 12 microns.

An exposed surface of the coating may have a roughness Ra of 0.8 microns or less, preferably 0.5 microns or less.

The coating or a topmost layer thereof may have a microhardness of at least 2000 $kG/mm^2$, preferably at least 2500 $kG/mm^2$, and even more preferably at least 2900 $kG/mm^2$.

Experiments made by the present applicant with various coating thicknesses have shown that to achieve a self-sharpening action, the coating must be sufficiently thick, and preferably at least 1 to 2 or possibly 3 microns. On the other hand, coatings thicker than 15–25 microns generally do not provide sufficient sharpness. An optimal coating thickness is therefore within this range of thicknesses The present applicant has also discovered that coatings having a low coefficient of friction and coatings having a smooth surface facilitate blade movement while cutting and further contribute to a smooth cutting action and cut quality. This appears to be particularly useful for cutting soft and weak materials like thin paper, which is easily damaged by tearing or rupturing.

The present invention can be applied in relation to various types of knives or cutting tools, such as for example an ordinary domestic knife, a disk shaped rotary knife used in industry for cutting paper, a guillotine-type knife, and cutting tools of various shapes. The invention can be applied in relation to tools for cutting metal, wood and/or plastics (among others), including saws, planes, drills and other machining tools.

The blade can be made either as a double-bevelled or as a single-bevelled blade. In the case of a single-bevelled blade, the coating is formed on a flat or on a bevelled side of the blade, in the case of a double-bevelled blade, either side of the blade can be coated.

Various coating technologies can be used for deposition of the coating material, among them Chemical Vapour Deposition (CVD).

CVD tungsten and tungsten carbide coatings described in WO 00/47796 have been used by the present applicant to produce a hard coating on a knife blade. When applied to steel, such coatings generally comprise an inner sub-layer usually made of nickel, copper or other metals (preferably resistant to fluorine), a layer of metal tungsten and further even harder layers containing tungsten carbide. The coating is produced by a CVD process from a gas mixture containing tungsten hexafluoride ($WF_6$), hydrogen ($H_2$) and carbon-containing oxygen-free gas, for example propane ($C_3H_8$), with the process temperature from 350° C. up to 650° C., preferably from 400° C. up to 550° C. The use of precursors free from oxygen, and particularly the innovative thermal pre-activation of the carbon-containing gas (as described in WO 00/47796) are the advantages of this method that allow a coating to be formed with very dense micro-crystalline structure and enhanced hardness. The thermal pre-activation of the carbon-containing gas gives effective control of the coating composition and serves to produce single-phase tungsten carbides and mixtures thereof, including coating layers consisting solely of tungsten carbides and which do not contain metallic tungsten, thus providing enhanced hardness. The coating phase composition has been analysed by way of X-ray diffraction analysis. Extensive experimentation and analysis of the processes taking place in the CVD furnace show that the phase composition of the coating depends principally on the temperature of the thermal pre-activation, varying for example from 500° C. up to 850° C., the partial pressure of the hydrocarbon gas and the general pressure in the reactor (0.1–150 kPa).

Preliminary activation of the hydrocarbon results in the formation of the necessary concentration of hydrocarbon radicals and their associates with fluorine in the gaseous phase over a wide range. This process, as described in WO 00/47796, makes it possible to alloy the carbides and/or mixtures thereof with fluorine and fluoride-carbon compositions. Fluorine, as the most active chemical element, strengthens the interatomic bonds when it penetrates into the carbide lattice. It is the strengthening of the interatomic bonds in the carbide which produces the increase in hardness.

In addition to the alloying effect, active fluorine and fluoride-carbon compositions form a deposit with a micro-layered, non-columnar structure, the various layers having different hardnesses due to non-uniformity of the alloying.

Coatings of thickness from 1 micron up to 25 microns, and hardness from 25 GPa up to 40 GPa were applied. The CVD process as described in WO 00/47796 makes it possible to produce layered coating structures with hardness varying from one layer to another, this being particularly favourable for achieving the self-sharpening effect. The coating preferably has a low coefficient of friction, typically below 0.3 against cemented carbide (WC/Co). Extensive experimentation was used to identify the coating parameters to provide the advantages of the present invention, including the coating structure, thickness, hardness and friction coefficient.

The cutting tool of embodiments of the present invention may be manufactured from one of the following base materials: hard alloys also known as cemented carbide, ceramics such as silicon carbide, silicon nitride, aluminium oxide, zirconium oxide, carbon-carbon composition materials etc., various iron-containing alloys such as iron, carbon steels, stainless steels, tool and high-speed steels and cast iron, or other materials from the following list: copper, silver, gold, cobalt, nickel, silicon, tantalum, niobium, vanadium, tungsten, molybdenum, carbon, boron, their alloys, compounds and mixtures, and also titanium alloys.

If the cutting tool is made of a chemically active base material such as iron, carbon steels, stainless steels, tool and high-speed steels, cast iron, titanium alloys etc., it is preferable to deposit intermediate coatings containing materials chemically resistant to hydrogen fluoride, such as those from the following list: copper, silver, gold, cobalt, nickel, rhodium, rhenium, platinum, iridium, tantalum, molybdenum, niobium, vanadium and boron. An intermediate coating of thickness 0.1–15 microns, preferably 0.5–5 microns, may be deposited by electrochemical or chemical deposition from aqueous solutions, melt electrolysis, chemical or physical vapour deposition (e.g. by means of magnetron spraying) or by other methods.

The cutting tool with an intermediate coating, preferably of nickel, copper or boron, is placed into a CVD reactor furnace, and has an internal layer of tungsten deposited first, followed by deposition of a coating consisting mainly of tungsten carbides or their mixtures, or mixtures of tungsten with carbon. The total thickness of the CVD coating may be from 1 micron up to 25 microns, with the ratio of the thicknesses of the internal and external layers ranging from 1:1 to 1:600.

After depositing the coating on one side of a cutting edge, the other side may be additionally sharpened by grinding or by any other technique. This forms an edge consisting of the hard coating layer and the basic blade material, usually steel. In the course of use, the basic blade material is removed by wear and abrasion, leaving a thin layer of the hard coating. When the basic blade material is not sufficient to support the hard coating, microscopic pieces of the coating may be broken away, typically following a layered pattern of the coating structure. This gives a smooth scalpel-like blade edge with sharpness that can not be achieved with thicker coatings or coatings having a columnar structure. Use of the blade actually enhances the edge sharpness.

Alternatively or in addition, in order to improve the cutting action further, the coated side of the blade can be additionally polished or ground so as to remove roughness on the coated surface that would otherwise brush against material being cut. This additional polishing or grinding could be made in a direction along the cutting edge, so that the polished blade will move smoothly and thus reduce the force required for cutting.

A smooth scalpel-like blade edge with enhanced sharpness made using the present invention is a particular advantage when the blade is cutting soft materials that could be easily damaged, for example thin toilet tissue. It has also been found by the present applicant that to achieve this scalpel-like blade, a sharpening process should include a stage of dressing or sharpening with a sharpening tool moving along the cutting edge to remove burrs and projecting areas of the coating or substrate material.

For a better understanding of the present invention and to show how it may be carried into effect, reference shall now be made, by way of reference, to the following examples and the accompanying drawing, in which:

FIG. 1 shows a graph indicating the cutting performance of knives with various coatings.

EXAMPLES

The examples given below illustrate the invention specifically in relation to the use of CVD coatings. However, these examples are not to be taken as limiting the scope of the invention to those specific processes, since other processes may also have the properties required.

Example 1

A series of test blades were made from martensitic stainless steel having the following specification:
0.35% carbon
12.5% chromium
Hardness: 54 Re
Dimensions: 120 mm×25 mm with a primary edge angle of 15°/side, The blades were subsequently coated by Hardide® on one side only as follows:

| Blade | Coating | Thickness/μm | Coating hardness/kG/mm$^2$ |
|---|---|---|---|
| 5 & 6 | Hardide ® H (hard) | 5 | 3100 |
| 7 & 8 | Hardide ® H (hard) | 10 | 3100 |
| 9 & 10 | Hardide ® M (multi-layer) | 12 | 2100 |

Hardide®-H coating has a sub-layer of metal tungsten 0.5 microns thick, and a layer of $W_2C$ 5 or 10 microns thick. Hardide®-M has a sub-layer of metal tungsten 0.5 microns thick, a layer of metal tungsten with carbon 10 microns thick, and a hardest top layer of $W_2C$ 2 microns thick.

The blades were then honed on a 320 grit oil stone on the non-coated side at an angle of 20° using an accurate blade honing fixture.

Evaluation Method:

The blades were subjected to cutting tests for sharpness and life to ISO 8442.5. The blades were mounted in the ISO cutting test machine specified such that the blades cut through 10 mm wide strips of manila card. The card comprised 95% cellulose fibre, the balance being made up of silica. The effect of the latter is to increase the wear rate during cutting. The blade was cycled back and forth over a distance of 40 mm at a speed of 50 mm/second under a load of 50N. The amount of card cut per cycle was recorded, this being a measure of the blade sharpness. All the blades were initially subjected to 60 cycles.

After the initial 60 cycles, the results were examined, and blades 5 and 7 were then subjected to further cycles to a total of 1060 cycles.

The results are shown in summary in Table 1 and FIG. 1. For comparison, typical figures for 15/20 micron Co/WC sprayed coatings and a standard martensitic stainless steel blade are also shown.

TABLE 1

| Blade | Initial sharpness | 60 cycle sharpness | Total at 60 | Total at 1060 |
|---|---|---|---|---|
| 5 (5 µm H) | 12 | 20.9 | 1212 | 16897 |
| 7 (10 µm H) | 26.3 | 27.9 | 1603 | 22233 |
| 9 (12 µm M) | 31.4 | 26.7 | 1715 | — |
| Co/WC | 18 | 17 | 1050 | 15000 |
| Standard martensitic steel blade | 40 | 3 | 647 | — |

The life performance of the various blades indicate that both Hardide®-H coatings and multilayer coatings perform well in terms of edge retention. The hard coatings generate a self sharpening action of the blades, as their sharpness increases with the number of cuts: the curves b5 and b7 of the attached FIG. 1 show a growth in cut depth with the number of cuts.

The coating becomes exposed at the tip as the base metal side of the edge is worn away, gradually making the blade sharper. However, after a certain time the coating partially collapses leaving a fractured and blunt tip or edge. The self-sharpening procedure then repeats itself over a significant number of cycles.

Comparison of these results with other coatings, such as for example typical WC/Co sprayed coating, shows that Hardide® coatings perform better in terms of sharpness. Well-known kitchen knives with a tungsten carbide/cobalt coating of thickness around 18/20 µm only achieve a first cut sharpness of around 18–20 mm and remain at approximately the same level, whereas the knives with Hardide® coating managed to achieve much better initial sharpness, this being maintained at a higher level over the testing period.

Example 2

A set of nine domestic knives made of stainless steel were coated with CVD coating, consisting of layers of nickel, tungsten and tungsten carbide. The knives were positioned in a vacuum chamber so that one side of each knife was masked. The coating was produced with three different thicknesses: three blades with a coating 6 microns thick, three blades with a coating 9 microns thick, and three blades with a coating 13 microns thick. The other side of the blade was sharpened by grinding, including edge dressing by way of a sharpening tool being moved along the cutting edge so as to remove burrs and projecting parts of coating and steel. The coating produced had a friction coefficient against WC/Co of 0.2.

The knives were tested on a test rig to cut 50 mm thick cardboard blocks under a fixed load by reciprocating movements, while the number of strokes required to cut the block was counted.

All the tested knives cut the first block of cardboard in approximately 5 strokes, and this number of strokes was generally maintained and gradually reduced during the tests which involved cutting 100 blocks. For comparison, a standard non-coated sharp knife cut the first block in 2–3 strokes, but the number of strokes increased up to 70–100 when it cut the 5th block as a result of the edge becoming blunt very quickly.

This test demonstrated that the coating provides a self-sharpening cutting edge.

Example 3

Two disk rotary knives were coated with a CVD coating consisting of layers of nickel, tungsten and tungsten carbide. The disks were positioned in a vacuum chamber so that one side of the knife had a coating of 5 microns in one case and 10 microns in the other. The coating micro-hardness was 3700 Hv. The disk knives were sharpened by dressing the edge and grinding another side of the edge, and observation of the edge under a microscope showed it to be smooth with a sharp scalpel-like edge.

Tests of the knives showed enhanced cutting action without damage to the material being cut (tissue paper). The standard blades were normally replaced every 12 hours for re-sharpening The Hardide®-coated blades were used continuously for 10 weeks without re-sharpening, and their sharpness and facilitated cutting action remained suitable for this demanding application. The increase in the continuous operation of the blade was in excess of factor of 100, this being due to the blade self-sharpening effect.

Example 4

Cutting tools for cutting polyethylene film from a solid block of plastic (polyethylene) by a process known as skiving were made of tool steel as a long bar with one or two corners profiled to make a sharp cutting edge. Because of the abrasive nature of the material and the process the tool had to be replaced for re-sharpening several times a day, and the longest any blade could last in production was around one day. Apart from quickly becoming blunt, traditional blades were vulnerable to chipping of the cutting edge caused by contamination in the plastic block.

Four cutting tools were coated with CVD tungsten carbide on a flat side of the bar, with the coating thickness varying from 1.5 microns up to 8 microns. The coating had micro-hardness of 3600 Hv and a friction coefficient against WC/Co of 0.2.

The trials continued for 7 months, and during the whole period of the trials the Hardide®-coated tools were re-sharpened only once, and no other cutting tools were used. The tests showed that the tool sharpness was maintained over a period at least 70 times longer than normal tool life.

Example 5

A blade of a plane was coated with CVD tungsten carbide so that a flat side of the blade had a hard coating. The other, bevelled, side of the blade was sharpened.

The plane maintained its blade sharpness for an operational period up to 3 times longer than a period after which a standard blade requires sharpening, before testing was stopped. It is expected that the coated blade will maintain its sharpness for even longer periods of operation.

Example 6

A metal cutting tool made of tool steel was coated with multi-layer CVD tungsten carbide on one side of its cutting edge. The coating consisted of a 1 micron nickel sub-layer, a 0.5 micron tungsten layer followed by alternating layers of tungsten carbide approximately 1.5 micron thick and tungsten approximately 0.5 micron thick, up to a total thickness of 10 microns. The coating had a friction coefficient against WC/Co of 0.2.

The tool was used for cutting aluminium, and tests showed that the tool had enhanced cutting quality, reduced sticking of aluminium shavings, and the tool remained sharp for at least four times longer than a normal non-coated tool. The tests were then stopped, but it is expected that the coated tool could continue cutting aluminium while remaining sharp due to the coating, thereby ensuring an enhanced quality of cut.

The preferred features of the invention are applicable to all aspects of the invention and may be used in any possible combination.

Throughout the description and claims of this specification, the words "comprise" and "contain" and variations of the words, for example "comprising" and "comprises", mean "including but not limited to", and are not intended to (and do not) exclude other components, integers, moieties, additives or steps.

The invention claimed is:

1. A self-sharpening cutting tool comprising:
   a cutting edge made of a first material, the cutting edge being coated only on one side thereof with a coating comprising tungsten carbide or mixtures of tungsten carbides, the coating substantially harder than the first material, wherein the coating has a layered or laminar microstructure aligned substantially parallel to the coated side of the cutting edge to enable wear or breaking off of micro-particles following the layered or laminar structure pattern.

2. A tool as claimed in claim 1, wherein the coating is substantially or entirely free of metallic tungsten.

3. A tool as claimed in claim 1, wherein the coating is a multilayered coating, with a topmost layer of the coating comprising tungsten carbide or mixtures thereof, substantially or entirely free of metallic tungsten.

4. A tool as claimed in claim 3, wherein the layers are arranged in sequentially increasing hardness from the cutting edge to a topmost layer of the coating.

5. A tool as claimed in claim 1, wherein the coating is a multilayered coating comprising layers of varying hardness.

6. A tool as claimed in claim 5, wherein the hardest layer is a topmost layer of the coating.

7. A tool as claimed in claim 5, wherein the hardest layer is an intermediate layer of the coating.

8. A tool as claimed in claim 5, wherein the hardest layer is a base layer of the coating.

9. A tool as claimed in claim 5, wherein the coating comprises layers of tungsten, tungsten carbides and/or mixtures of tungsten with tungsten carbides alloyed with fluorine in amounts ranging from about 0.0005 to about 0.5 wt %.

10. A tool as claimed in claim 5, wherein the coating comprises layers of tungsten and tungsten carbides substantially or entirely free of metallic tungsten, being alloyed with fluorine in amounts ranging from about 0.0005 to about 0.5 wt %.

11. A tool as claimed in claim 5, wherein the coating has a base layer of tungsten.

12. A tool as claimed in claim 1, wherein the coating is a multilayered coating comprising layers of varying hardness, the hardest layer of which comprises tungsten carbide or mixtures thereof substantially or entirely free of metallic tungsten.

13. A tool as claimed in claim 1, wherein the coating or a topmost layer thereof has a friction coefficient against WC/Co of no more than 0.3.

14. A tool as claimed in claim 1, wherein the coating is produced by Vapour Deposition in a vacuum chamber at a pressure lower than atmospheric pressure and at a temperature above about 350° C.

15. A tool as claimed in claim 1, wherein the coating has a total thickness from about 1 to about 25 micrometers.

16. A tool as claimed in claim 1, wherein an exposed surface of the coating has a roughness of no more than about 0.8 Ra micrometers.

17. A tool as claimed in claim 1, wherein the coating or a topmost layer thereof has a microhardness of at least about 2000 kG/mm$^2$.

18. A tool as claimed in claim 1, wherein an exposed surface of the coating is ground or polished in a direction substantially parallel to the coated surface of the cutting edge.

19. A tool as claimed in claim 1, wherein the coating is produced by Chemical Vapour Deposition in a vacuum chamber at a pressure lower than atmospheric pressure and at a temperature from about 450 to about 550° C.

20. A tool as claimed in claim 1, wherein the coating has a total thickness of about 3 to about 12 micrometers.

21. A tool as claimed in claim 1, wherein an exposed surface of the coating has a roughness Ra of about 0.5 microns or less.

22. A tool as claimed in claim 1, wherein the coating or a topmost layer thereof has a microhardness of at least 2500 kG/mm$^2$.

23. A tool as claimed in claim 1, wherein the coating or a topmost layer thereof has a microhardness of at least 2900 kG/mm$^2$.

24. A method of manufacturing a self-sharpening cutting tool, the method comprising:
   providing a cutting edge made of a first material or materials; and
   coating only one side of the cutting edge with a coating comprising tungsten carbide or mixtures of tungsten carbides, the coating substantially harder than the first material or materials;
   wherein the coating has a layered or laminar microstructure aligned substantially parallel to the coated side of the cutting edge to enable wear or breaking off of micro-particles following the layered or laminar structure pattern.

25. A method according to claim 24, wherein the coating is substantially or entirely free of metallic tungsten.

26. A method according to claim 24, wherein the coating is a multilayered coating, the topmost layer of the coating comprising tungsten carbide or mixtures thereof, substantially or entirely free of metallic tungsten.

27. A method according to claim 26, wherein the layers are arranged in sequentially increasing order of hardness from the cutting edge to a topmost layer of the coating.

28. A method according to claim 24, wherein the coating is a multilayered coating comprising layers of varying hardness.

29. A method according to claim 28, wherein the hardest layer is a topmost layer of the coating.

30. A method according to claim 28, wherein the hardest layer is an intermediate layer of the coating.

31. A method according to claim 28, wherein the hardest layer is a base layer of the coating.

32. A method according to claim 28, wherein the coating comprises layers of tungsten, tungsten carbides or mixtures thereof, alloyed with fluorine in amounts ranging from about 0.0005 to about 0.5 wt %.

33. A method according to claim 28, wherein the coating comprises layers of tungsten and tungsten carbides substantially or entirely free of metallic tungsten, being alloyed with fluorine in amounts ranging from about 0.0005 to about 0.5 wt %.

34. A method according to claim 28, wherein the coating has a base layer of tungsten.

35. A method according to claim 24, wherein the coating is a multilayered coating comprising layers of varying hardness, the hardest layer of which comprises tungsten carbide or mixtures thereof, substantially or entirely free of metallic tungsten.

36. A method according to claim 24, wherein the coating or a topmost layer thereof has a friction coefficient against WC/Co of no more than 0.3.

37. A method according to claim 24, wherein the coating is applied by Chemical Vapour Deposition in a vacuum chamber at a pressure lower than atmospheric pressure and at a temperature of no less than about 350° C.

38. A method according to claim 24, wherein the coating is applied to a total thickness from about 1 to about 25 micrometers.

39. A method according to claim 24, wherein an exposed surface of the coating after application has a roughness Ra of no more than about 0.8 micrometer.

40. A method according to claim 24, wherein the coating or a topmost layer thereof has a microhardness of at least about 2000 kG/mm$^2$.

41. A method according to claim 24, wherein an exposed surface of the coating, after application of the coating, is ground or polished in a direction substantially parallel to the coated surface of the cutting edge.

42. A method according to claim 24, wherein the coating is applied by Chemical Vapour Deposition in a vacuum chamber at a pressure lower than atmospheric pressure and at a temperature from about 450 to about 550° C.

43. A method according to claim 24, wherein the coating is applied to a total thickness from about 3 to about 12 micrometers.

44. A method according to claim 24, wherein an exposed surface of the coating after application has a roughness Ra of no more than 0.5 micrometers.

45. A method according to claim 24, wherein the coating or a topmost layer thereof has a microhardness of at least 2500 kG/mm$^2$.

46. A method according to claim 24, wherein the coating or a topmost layer thereof has a microhardness of at least 2900 kG/mm$^2$.

\* \* \* \* \*